United States Patent
Urvas

(10) Patent No.: US 8,085,890 B2
(45) Date of Patent: Dec. 27, 2011

(54) APPARATUS AND METHOD FOR BASE BAND FILTERING

(75) Inventor: Ilkka Erik Urvas, Espoo (FI)

(73) Assignee: Nokia Corporation (FI)

( * ) Notice: Subject to any disclaimer, the term of this patent is extended or adjusted under 35 U.S.C. 154(b) by 1457 days.

(21) Appl. No.: 11/466,011

(22) Filed: Aug. 21, 2006

(65) Prior Publication Data

US 2007/0258526 A1    Nov. 8, 2007

(30) Foreign Application Priority Data

May 3, 2006    (EP) .................................... 06009160

(51) Int. Cl.
*H04B 1/00*    (2006.01)

(52) U.S. Cl. ......... 375/350; 375/260; 375/346; 375/316

(58) Field of Classification Search .................. 375/350, 375/346, 316; 455/307; 708/300; 327/384, 327/551, 310

See application file for complete search history.

(56) References Cited

U.S. PATENT DOCUMENTS

| 5,270,953 | A  | * | 12/1993 | White .......................... 708/321 |
| 5,598,436 | A  | * | 1/1997  | Brajal et al. .................. 375/297 |
| 6,704,438 | B1 | * | 3/2004  | Alexandru ..................... 382/128 |
| 6,792,057 | B2 | * | 9/2004  | Kabel et al. ................... 375/346 |
| 7,103,112 | B2 | * | 9/2006  | Webster et al. ................ 375/298 |
| 7,463,697 | B2 | * | 12/2008 | Maltsev et al. ................ 375/297 |
| 2003/0123383 | A1 | * | 7/2003 | Korobkov et al. ............. 370/208 |
| 2004/0100897 | A1 | * | 5/2004 | Shattil ............................ 370/206 |
| 2006/0067426 | A1 | * | 3/2006 | Maltsev et al. ................ 375/297 |

* cited by examiner

*Primary Examiner* — Shuwang Liu
*Assistant Examiner* — Helene Tayong
(74) *Attorney, Agent, or Firm* — Banner & Witcoff, Ltd.

(57) ABSTRACT

Disclosed is a base band filter apparatus and a method for base band filtering comprising filtering a base band signal in time domain, said filtering including a filter transfer function (F), wherein the base band signal is provided in frequency domain, the frequency domain base band signal is multiplicated by an inverse filter transfer function ($F^{-1}$), and the signal provided as the result of said multiplication is converted from frequency domain to time domain and provided to said filtering.

20 Claims, 5 Drawing Sheets

United States Patent US 8,085,890 B2

APPARATUS AND METHOD FOR BASE BAND FILTERING

FIELD OF THE INVENTION

This application claims priority from foreign European Patent Application No. EP 06009160.0. The present invention relates to base band filters and filtering methods. In particular, the present invention relates to base band filters and methods that filter base band signals in the time domain and include a filter transfer function.

BACKGROUND OF THE INVENTION

Wireless communication systems typically include transmitters that have to generate signals which are strictly limited to the specified frequency channel in order to avoid interference with other users. For this reason, the transmitters typically have radio frequency filters in order to attenuate interference signals between different communication systems such as GSM (global system for mobile communication) and the transmitting and receiving channels within a system. The interference between different users operating within the same channel is limited by the use of base band filters. Since the maximum data transfer speed is correlated to the performance of the base band filters, they can become a bottleneck of the performance of the whole system and further result in high circuit complexity.

Current state-of-the-art implementation would be to use in the transmitter a base band filter having a small amplitude variation, e.g. 0.1 dB ripple, in the pass band or the frequency band which is occupied by the wanted signal. The stop band attenuation is usually specified by regulations which define the spectral purity so as to typically limit the maximum out-of-band spectral power which otherwise can harm other radio frequency usage. A main problem is that small amplitude ripple in pass band and typically high requirement for stop band attenuation result in the provision of a filter apparatus having a long impulse response in time domain, which means that the signal energy will be distributed in time domain so that part of the energy which is in one transmitted symbol may leak to the next symbol causing inter-symbol-interference.

Both digital and analog base band filters have a trade-off between a wanted behavior e.g. with regard to base-band spectral flatness and stop-band attenuation, an unwanted behavior e.g. with regard to a distortion of the signal and the length of the impulse response of the filter apparatus and the complexity of the filter apparatus. High order filters result in low amplitude variation in the pass-band and high stop-band rejection, but also have a long impulse response which spreads the filtered signal energy in time domain, and further require complex circuitry. A system with low order filtering, however, results in poor spectral efficiency, since the separation between different users in frequency domain must be increased to avoid interference. On the other hand, long impulse responses created by high order filtering cause signal spreading in time domain, which results in inter-symbol interference or requires longer guard intervals between transmitted symbols, both of which limit the speed of the data transfer.

SUMMARY OF THE INVENTION

Aspects of the invention overcome problems and limitations of the prior art by providing systems and methods that provide an improved way for implementation of a base band filtering with better performance and lower circuit complexity.

In one aspect of the present invention, there is provided a base band filter apparatus comprising filter means for filtering a base band signal in time domain, said filter means having a filter transfer function, further characterized by means for providing the base band signal in frequency domain, multiplying means for multiplying said frequency domain base band signal by an inverse filter transfer function of said filter means, and frequency-to-time domain conversion means for converting the output of said multiplying means from frequency domain to time domain and providing said time domain signal to said filtering means.

According to a second aspect of the present invention, there is provided a method for base band filtering, comprising the step of: filtering a base band signal in time domain, said filtering including a filter transfer function, characterized by the further steps of: providing the base band signal in frequency domain, multiplying said frequency domain base band signal by an inverse filter transfer function, and converting the signal provided as the result of said multiplying step from frequency domain to time domain and providing said time domain signal to the filtering step.

With embodiments of the present invention, it is possible to implement base band filtering with equivalent or better amplitude response with lower circuit complexity or with significantly better amplitude response with equivalent circuit complexity, compared to conventional base band filtering. Further, embodiments of the present invention result in a reduction of the impulse response length of a base band with given filtering performance. Moreover, it is possible with various embodiments the present invention to filter in and near band interferences generated e.g. by discontinuity between symbols since the filter can have attenuation on the pass-band, which was not possible with the conventional base band filtering. Finally, embodiments of the present invention offer more degree of freedom in the design since the transfer function can vary a lot in arbitrary ways within the pass band. Hence, it may be possible to generate e.g. special stop band notches which can improve the filtering performance.

Furthermore, embodiments of the present invention provide for a simpler filtering wherein a significantly greater amplitude response variation in the pass band is allowed while maintaining a large enough attenuation in the stop band. In order to essentially maintain the original frequency response of the base band, the base band signal is wanted in frequency domain and multiplied by the inverse transfer function of the filtering in frequency domain. Namely, it has been found that the multiplication is to be done in frequency domain, e.g. before the frequency-to-time conversion is necessary, in order to prevent a distortion of the signal. The multiplication can be done at any point before the signal is in time domain. In certain embodiments the multiplication is done as close to the frequency-to-time domain conversion as possible.

Moreover, embodiments of the present invention provide ways to generate a base band frequency domain transfer function equivalent to the case where high order base band digital time domain filters and/or analog filters are used along with the use of lower order filters.

Filters designed in accordance with at least some of the embodiments of the invention may result in reduced power consumption.

Embodiments of the present invention can be implemented optionally for digital or analog filtering.

Embodiments of the present invention can be used in wireless systems and have in particular great benefit in the implementation of WLAN (wireless local area network), WIMAX, EUTRA, UWB and other OFDM (orthogonal frequency division multiplexing) and SC-FDMA (single-carrier frequency division multiple access) based transmitters in mobile terminals, base stations etc. However, the present invention is not limited to such special applications, but can be used, for example, for base band signal generation in general.

In one embodiment, if the amplitude response of the filtering is to be compensated only, it is sufficient that the inverse filter transfer function includes at least one coefficient being a real number. However, if both the amplitude and phase response need to be compensated, the inverse filter transfer function may include at least one coefficient which is a complex number.

In addition to simplifying a single filtering by means of embodiments of the present invention, it is also possible to simplify several filters, wherein the filter means comprises a plurality of filters or the filtering step comprises a plurality of filtering processes, each filter/filtering process having an individual filter transfer function, and the frequency domain base band signal is multiplicated by a coefficient vector including the inverse filter transfer functions of all the filters/filtering processes. In the latter embodiments, the frequency domain base band signal may be a vector including a plurality of complex numbers representing a sample or symbol of the base band signal. If the representation of the multiplication result requires more bits than the frequency domain base band signal vector before multiplication, one option is to have the multiplication as close to the frequency-to-time domain conversion as possible.

The frequency-to-time domain conversion may be carried out by an inverse fast fourier transform process. As pointed out above, the implementation according to at least some embodiments of the present invention requires that the base band signal is represented in frequency domain before the filtering. In systems, where the base band signal is in time domain, a time-to-frequency domain conversion may be utilized in order to provide the base band signal in frequency domain. The time-to-frequency domain conversion may be carried out by a fast fourier transform process.

Embodiments of the present invention can be implemented in a transmitter using a cyclic prefix, wherein, after a symbol in a signal transmitted by said transmitter is converted from frequency domain to time domain, a part of said signal from the end is copied to the beginning of said symbol.

BRIEF DESCRIPTION OF THE DRAWINGS

The present invention will be readily understood by the following detailed description in conjunction with the accompanying drawings, wherein like reference numerals designate like structural elements, and in which.

DESCRIPTION OF THE PREFERRED EMBODIMENTS

Figure 1:
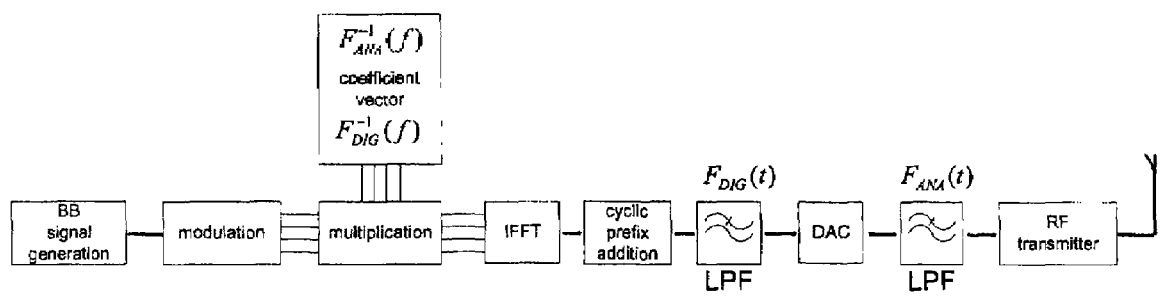
FIG. 1 is a block diagram of a frequency domain enhanced base band filtering according to a first embodiment of the present invention.

FIG. 1 shows a simplified block diagram of a frequency domain enhanced base band filtering according to an embodiment of the present invention. Starting from the base band signal generation and ending at a radio frequency transmitter. After a modulation, the base band signal is provided in frequency domain. In this embodiment, the way of obtaining a simpler filtering, either in digital or analog domain, is to allow significantly greater amplitude variation in the pass band of the filter while maintaining a large enough attenuation in the stop band. In order to maintain the original frequency response of the base band, the frequency domain base band signal after modulation is multiplied by an inverse transfer function of the simplified filtering in frequency domain. In FIG. 1, the inverse transfer function is shown as a coefficient vector $F^{-1}_{ANA}(f)$ (analog domain) and $F^{-1}_{DIG}(f)$ (digital domain). In the following, the filter used for the simplified filtering will be referred to as "enhanced" or "simplified" filter.

As further shown in FIG. 1, the signal which consists of the result of the multiplication is converted from frequency domain to time domain by an inverse fast fourier transform process. This process is carried out in a circuit element IFFT of FIG. 1. The output of the IFFT is a time domain signal. The process carried out in the embodiment shown in FIG. 1 and described so far has been done in the digital domain.

According to the embodiment shown in FIG. 1, a cyclic prefix is added to the output of the IFFT in the time domain. The addition of a cyclic prefix in this part of the base band processing does not have an impact on the transmitter. Namely, the addition of a cyclic prefix to a or each symbol solves both inter-symbol-interferences and inter-channel-interferences. Assuming that the channel impulse response has a known length L, the prefix consists simply of copying the last L-1 values from each symbol and appending them in the same order to the front of the symbol. By doing so, the convolution of the impulse response with the signal at the end of a symbol does not affect any of the actual data at the beginning of the next symbol. The above described enhanced filtering can be implemented in transmitters which use a cyclic prefix, wherein, after a symbol in the transmitted signal is converted from frequency to time domain, a part of the signal from the end is copied to the beginning of the symbol.

The embodiment of FIG. 1 further comprises a digital low pass filter LPF having a digital filter transfer function $F_{DIG}(t)$ in time domain wherein the time domain output signal of IFFT is input. The output of the low pass filter LPF is converted from digital to analog domain by a digital-to-analog converter DAC and thereafter input into an analog low pass filter LPF having an analog filter transfer function $F_{ANA}(t)$. The output of the analog low pass filter LPF is finally transmitted by the radio frequency transmitter designated in FIG. 1 as RF transmitter.

In addition to simplifying a filter that includes a single filter element, it is also possible to simplify a filter that consists of several filter elements and multiply the frequency domain signal with a coefficient vector where the inverse transfer function of all filter elements are combined. A digital base band filter that is enhanced can also operate at an oversampled frequency.

Let Y be a vector with n complex numbers representing a base band signal sample (symbol) in frequency domain. Respectively, A is the coefficient vector to compensate the filter transfer function, with n real or complex numbers. Real numbers can be used if only the amplitude response of the filter is compensated; complex numbers can be used if both the amplitude and phase response need to be compensated. X is the frequency domain compensated base band signal which is generated by multiplication of A and Y, as shown as follows:

$$x_2 = a_1 \cdot y_1$$

$$x_2 = a_2 \cdot y_2$$

$$\overline{X} = \overline{A} \cdot \overline{Y}$$

or $$x_{n-1} = a_{n-1} \cdot y_{n-1}$$

$$x_n = a_n \cdot y_n$$

Figure 2:
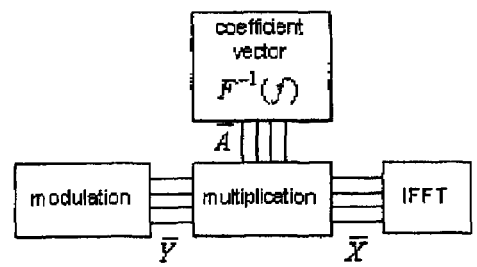
FIG. 2 shows a portion of FIG. 1.

The coefficients $x_n$, $a_n$, and $y_n$ are at the same base band frequency; i.e. $a_n$ represents the filter inverse transfer function at the same frequency as $x_n$; and y represents the base band signal. This is shown in FIG. 2.

A represents the required samples from the inverse of the filter frequency domain transfer function. In case of multiple filters, A is the product of the transfer functions of those filters.

The multiplication can be done at any point before the signal is in time domain. It may be best to have the multiplication as close to the signal conversion from frequency to time domain if the representation of X requires more bits than Y.

Figure 3:
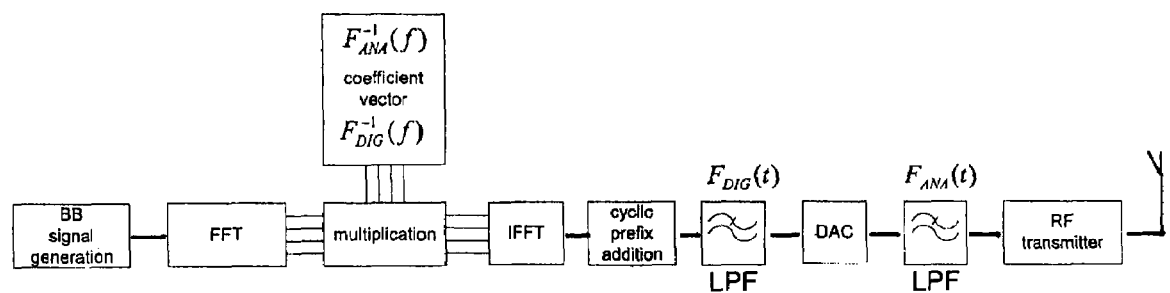
FIG. 3 is a block diagram of a frequency domain enhanced base band filtering in systems with time domain base band signal generation according to a second embodiment of the present invention.

The implementation requires that the base band signal is represented in frequency domain before the filtering. In systems where the base band signal is generated in time domain, it is possible to make a time-to-frequency domain conversion such as fast fourier transform process carried out by a circuit element FFT, and then complete the compensation in the same way, as described above, and to convert the signal back to time domain as shown in FIG. 3.

Figure 4:
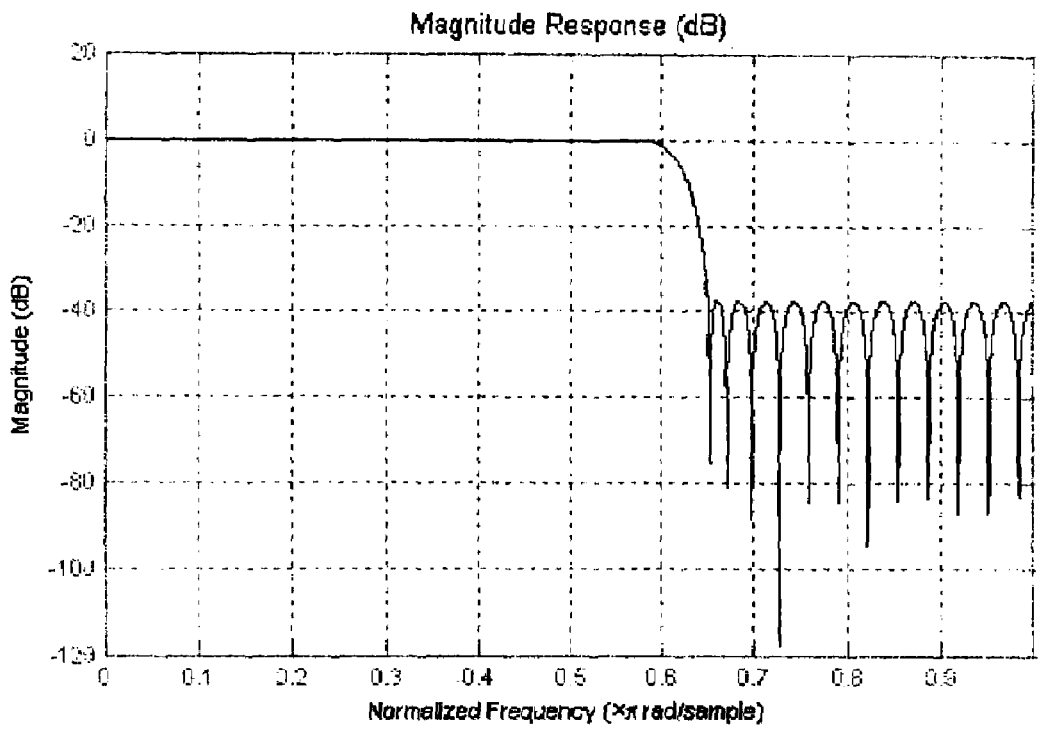
FIG. 4 is a graph showing an amplitude versus frequency response of a 65 tap FIR low-pass filter.
Figure 5:
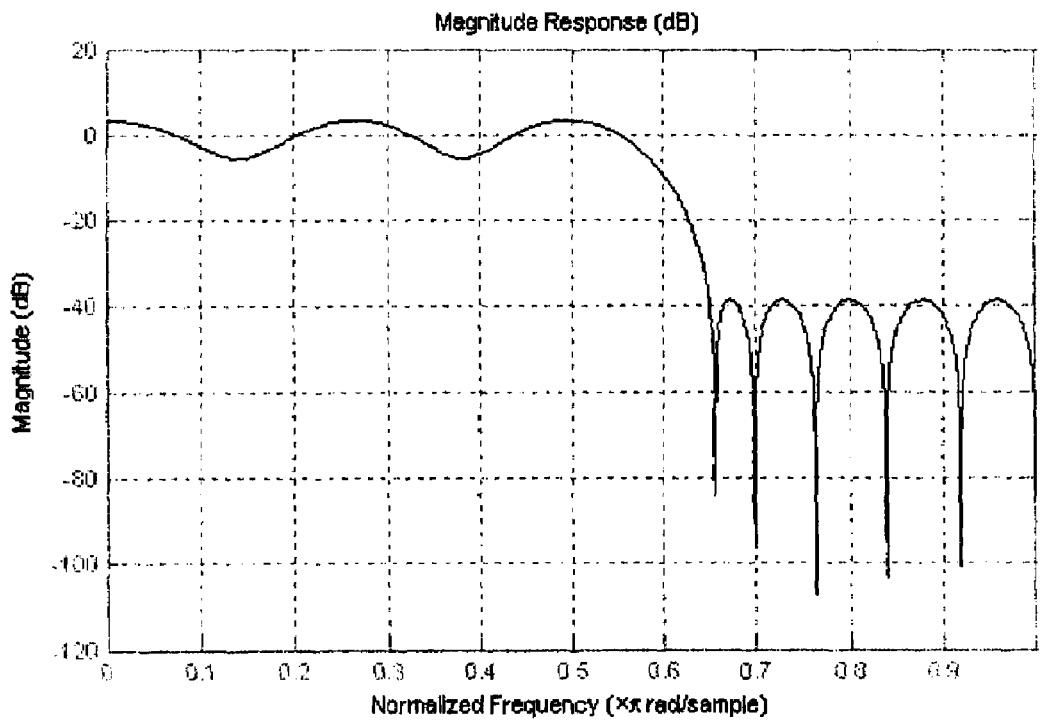
FIG. 5 is a graph showing an amplitude versus frequency response of a 22 tap FIR low-pass filter.

The operation of the base band filtering in accordance with embodiments of the invention is demonstrated by two simulations of an OFDM base band signal generation with traditional base band filtering and with the enhanced base band filtering, with reference to FIGS. 4 to 9. Both cases are using QPSK modulated OFDM with 600 sub-carriers with 15 kHz spacing i.e. the 10 MHz channel bandwidth case of EUTRA downlink transmission. The base band clocking frequency is 15.36 MHz. The reference case uses a 65 tap Nyquist rate FIR (finite impulse response) filter with 0.1 dB pass band variation and 38 dB stop band attenuation. The enhanced case uses a 22 tap Nyquist rate FIR filter with 10 dB pass band variation and 38 dB stop band attenuation. The amplitude response of these filters is shown in FIG. 4 and FIG. 5. The enhanced filter has not been optimized for this case but was chosen as an example of what could be easily possible to implement.

Figure 6:
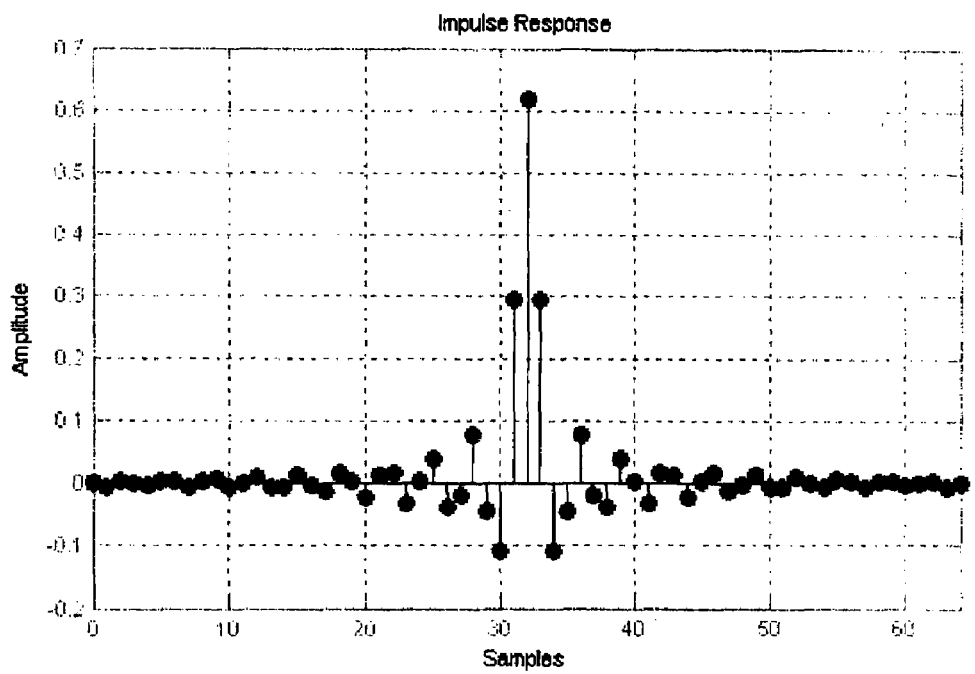
FIG. 6 is graph showing the impulse response of the 65 tap FIR low-pass filter.
Figure 7:
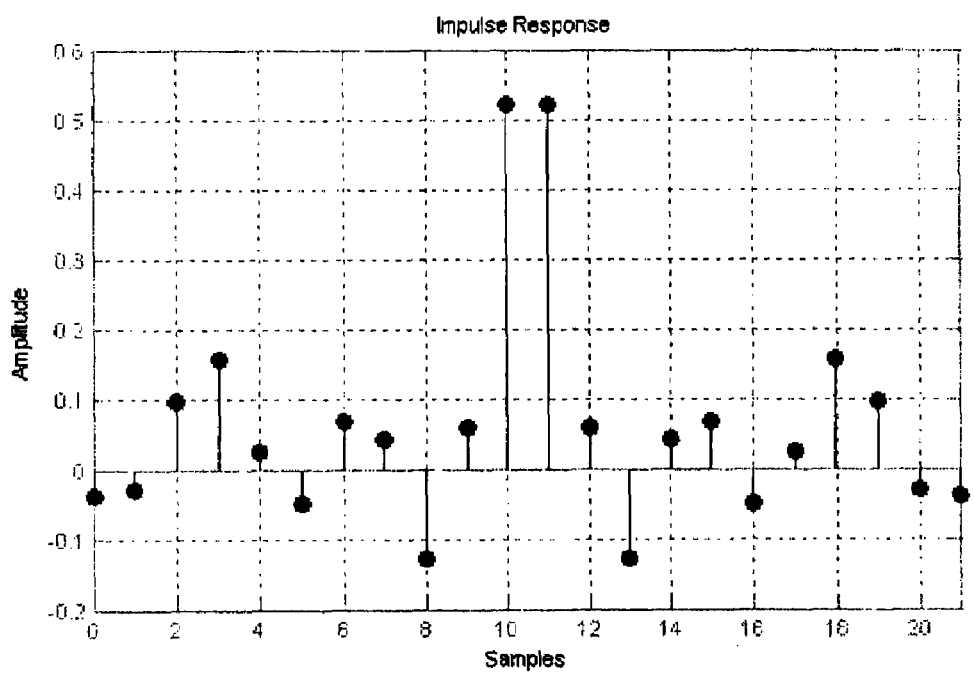
FIG. 7 is graph showing the impulse response of the 22 tap FIR low-pass filter.

The impulse responses of the reference and enhanced filter are shown in FIG. 6 and FIG. 7. The impulse response of the filter defines how the filtered signal energy spreads in time. The signal spreading is highly unwanted for example in OFDM since it increases the inter-symbol interference and therefore limits the maximum achievable data rates. The impulse response of the enhanced filter is only about one third of the reference case.

Figure 8:
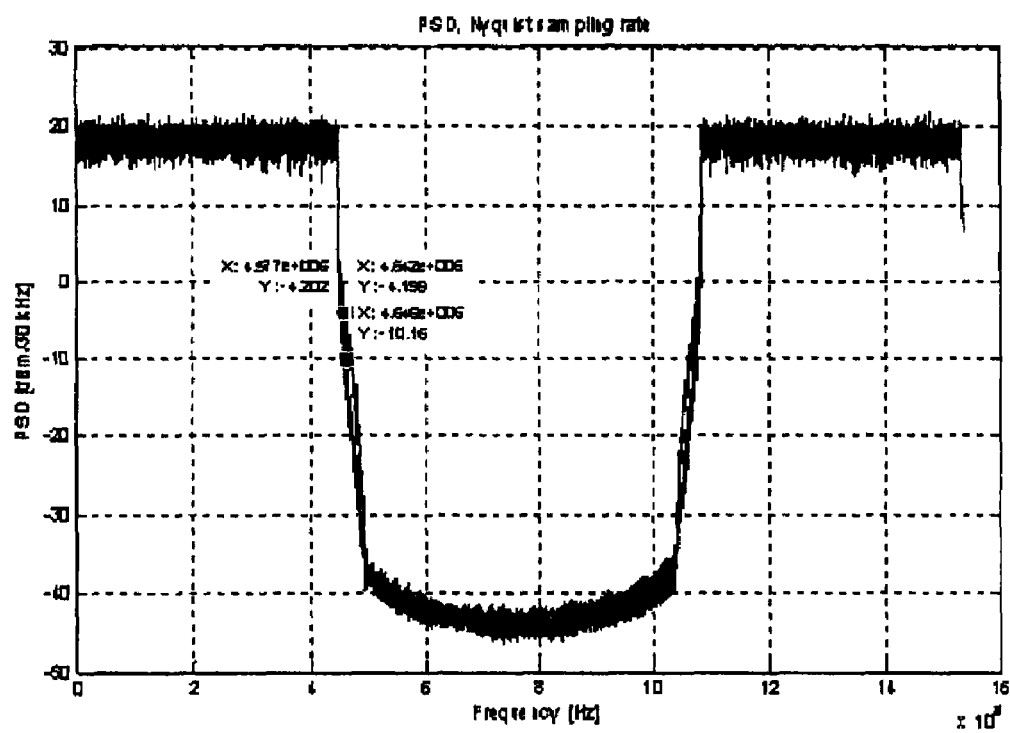
FIG. 8 is a graph showing an OFDM base band spectrum of 600 sub-carriers with 15 kHz sub-carrier offset at Nyquist frequency using reference filtering with the 65 tap FIR low-pass filter and an enhanced filtering with the 22 tap FIR low-pass filter.

FIG. 8 shows the spectra of the two base band signal cases overlapped in the same figure. The reference signal has a worse performance on the transition region from pass band to stop band. As can be seen, there is no significant difference in the pass band and stop band attenuation so that the performance of the filters is equally good at those areas. The noise in the stop band is larger for the reference case, but the minimum attenuation in the stop band is very similar.

Figure 9:
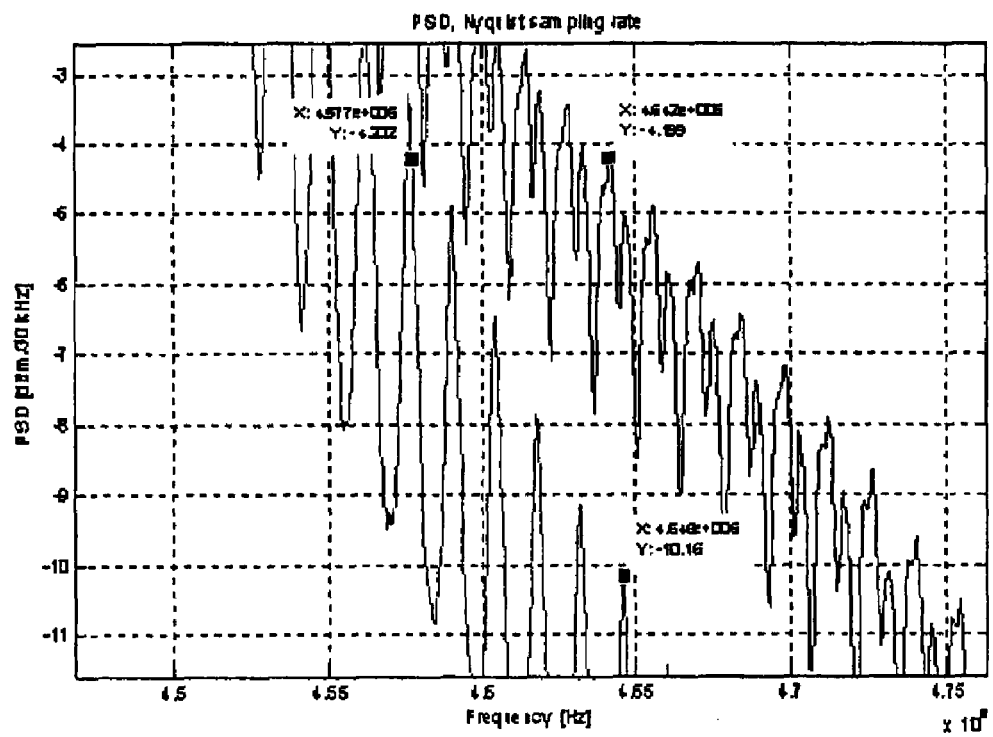
FIG. 9 shows an enlarged extract portion of FIG. 8.

FIG. 9 shows a close-up of FIG. 8. In OFDM there are discontinuities of the signal in time domain between the modulated symbols which causes signal spreading which can be regarded as noise or interference occurring both on the transmit channel and the adjacent channel. Since the enhanced filter affects this interference already starting from the pass band, the performance is better in the transition band. As an example, the better filtering in the transition band can be used to increase the number of subcarriers in OFDM.

The better base band performance achieved by enhanced filtering can be used to improve the spectrum efficiency, i.e. the data transfer speed in communication systems. It is also possible to trade off the good base band performance to ease the implementation of other transmitter parts such as the power amplifier and the clipping algorithms.

Other base band signal processing, e.g. signal clipping and pre-distortion, should take into account that the base band signal has been altered between the multiplication and the last enhanced filter if it modifies the signal at this part of the base band chain.

Embodiments of the invention may require an increased number of bits to represent the frequency domain signal after the multiplication with the coefficient vector. The accuracy of the base band signal in time domain depends on the number of used bits after the multiplication.

Finally, it should be noted that the above preferred descriptions are of preferred examples for implementing embodiments of the present invention, but the scope of the present invention should not necessarily be limited by this description. It will be apparent to those skilled in the art that a person understanding this invention may conceive of changes or other embodiments or variations, which utilize the principles of this invention without departing from the broader spirit and scope of the invention as set forth in the appended claims. All are considered within the sphere, spirit, and scope of the invention.

The invention claimed is:

1. An apparatus comprising:
    a plurality of filter elements, wherein each filter element of said plurality of filter elements has an individual filter transfer function;
    a multiplier configured to multiply a frequency domain base band signal by an inverse filter transfer function of said plurality of filter elements, wherein multiplying said frequency domain base band signal by said inverse filter transfer function of said plurality of filter elements includes multiplying said frequency domain base band signal by a coefficient vector that includes inverse filter transfer functions of said plurality of filter elements, and wherein said coefficient vector includes both real and complex numbers; and
    a frequency-to-time domain converter configured to convert an output of said multiplier from a frequency domain signal to a time domain signal and provide said time domain signal to at least one of said plurality of filter elements;

wherein said plurality of filter elements are configured to filter said time domain signal.

2. The apparatus according to claim 1, wherein said inverse filter transfer function of said plurality of filter elements includes at least one coefficient being a real number if only an amplitude response of at least one of said plurality of filter elements is to be compensated.

3. The apparatus according to claim 1, wherein said inverse filter transfer function of said plurality of filter elements includes at least one coefficient being a complex number if both an amplitude and phase response of at least one of said plurality of filter elements are to be compensated.

4. The apparatus according to claim 1, wherein the coefficient vector includes said individual inverse filter transfer function of each of said plurality of filter elements.

5. The apparatus according to claim 4, wherein said frequency domain base band signal is a vector including a plurality of complex numbers representing a sample or symbol of a base band signal.

6. The apparatus according to claim 5, wherein said frequency-to-time domain converter comprises an inverse fast fourier transform converter.

7. The apparatus according to claim 1, further including a time-to-frequency domain converter that converts a base band signal from time domain to frequency domain.

8. The apparatus according to claim 7, wherein said time-to-frequency domain converter comprises a fast fourier transform converter.

9. The apparatus according to claim 1, further including a transmitter that uses a cyclic prefix, wherein, after a symbol in a signal transmitted by said transmitter is converted from frequency to time domain, a part of said signal from an end is copied to the beginning of said symbol.

10. The apparatus of claim 1, wherein said plurality of filter elements includes a digital filter element and an analog filter element.

11. A method, comprising:
(a) providing a frequency domain base band signal;
(b) multiplying said frequency domain base band signal by an inverse filter transfer function of a plurality of filter elements, wherein each filter element of said plurality of filter elements has an individual filter transfer function, wherein multiplying said frequency domain base band signal by said inverse filter transfer function of said plurality of filter elements includes multiplying said frequency domain base band signal by a coefficient vector that includes inverse filter transfer functions of said plurality of filter elements, and wherein said coefficient vector includes both real and complex numbers;
(c) converting a signal provided as the result of (b) from frequency domain to time domain; and
(d) filtering a time domain base band signal produced in (c) with said plurality of filter elements.

12. The method according to claim 11, wherein said inverse filter transfer function of said plurality of filter elements includes at least one coefficient being a real number if only an amplitude response of at least one of said plurality of filter elements is to be compensated.

13. The method according to claim 11, wherein said inverse filter transfer function of said plurality of filter elements includes at least one coefficient being a complex number if both an amplitude and phase response of at least one of said plurality of filter elements are to be compensated.

14. The method according to claim 13, wherein said coefficient vector includes said individual inverse filter transfer function of each of said plurality of filter elements.

15. The method according to claim 14, wherein said frequency domain base band signal is a vector including a plurality of complex numbers representing a sample or symbol of a base band signal.

16. The method according to claim 15, wherein (c) comprises an inverse fast fourier transform process (IFFT).

17. The method according to claim 15, wherein (a) comprises a process for converting said base band signal from time domain to frequency domain.

18. The method according to claim 17, wherein said time-to-frequency domain converting process comprises a fast fourier transform process (FFT).

19. The method according to claim 18, wherein the method is adapted to be carried out in a transmitter using a cyclic prefix, wherein, after a symbol in a signal transmitted by said transmitter is converted from frequency domain to time domain, a part of said signal from an end is copied to the beginning of said symbol.

20. The method of claim 11, wherein said plurality of filter elements includes a digital filter element and an analog filter element.

* * * * *